US006965162B2

(12) United States Patent
Yoshino et al.

(10) Patent No.: US 6,965,162 B2
(45) Date of Patent: Nov. 15, 2005

(54) SEMICONDUCTOR CHIP MOUNTING SUBSTRATE AND SEMICONDUCTOR DEVICE USING IT

(75) Inventors: Makoto Yoshino, Beppu (JP); Kunio Sakamoto, Oita (JP); Kensho Murata, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 310 days.

(21) Appl. No.: 10/226,539

(22) Filed: Aug. 23, 2002

(65) Prior Publication Data

US 2003/0039102 A1 Feb. 27, 2003

(30) Foreign Application Priority Data

Aug. 23, 2001 (JP) ....................................... 2001-252658

(51) Int. Cl.[7] ................................................ H01L 23/13

(52) U.S. Cl. ....................... 257/701; 257/782; 257/784; 174/260

(58) Field of Search ................................ 257/782–784, 257/668, 669, 676, 701, 702; 174/258, 260; 361/783; 438/106, 118, 125; 29/832, 840

(56) References Cited

U.S. PATENT DOCUMENTS

| | | | | | |
|---|---|---|---|---|---|
| 5,729,049 | A | * | 3/1998 | Corisis et al. | 257/666 |
| 6,232,650 | B1 | * | 5/2001 | Fujisawa et al. | 257/666 |
| 6,562,661 | B2 | * | 5/2003 | Grigg | 438/125 |
| 6,853,086 | B1 | * | 2/2005 | Nakayama | 257/778 |

* cited by examiner

*Primary Examiner*—John B. Vigushin
(74) *Attorney, Agent, or Firm*—Yingsheng Tung; Wade James Brady, III; Frederick J. Telecky, Jr.

(57) ABSTRACT

A semiconductor device designed to reduce the warp of a substrate due to curing contraction, etc. of an insulation pattern while forming the insulation pattern on the surface of a substrate so that it may be interposed between a semiconductor chip and a conductor pattern by offering a semiconductor chip mounting substrate equipped with a flexible substrate 11 (insulating film 16) having a chip mounting region 19 for mounting a semiconductor chip 13 via an adhesive 12, conductor patterns 20 that are formed on the surface of the above-mentioned substrate 11 and electrically connected to the semiconductor chip 13 in an external region of the above-mentioned chip mounting region 19, and an insulation pattern 21 formed on the surface of the substrate 11 and partially in the chip mounting region 19 so that it may be interposed between the semiconductor chip 13 and the conductor patterns 20.

9 Claims, 4 Drawing Sheets

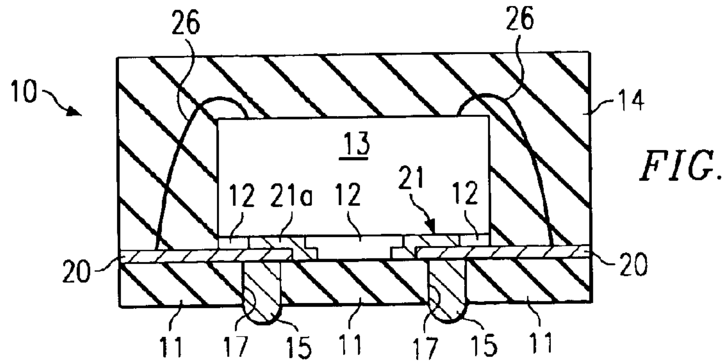
FIG. 1
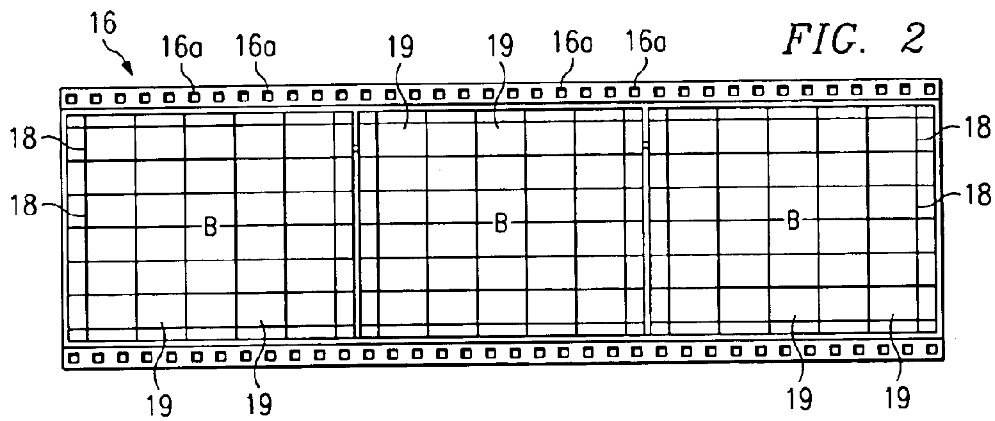
FIG. 2
FIG. 3
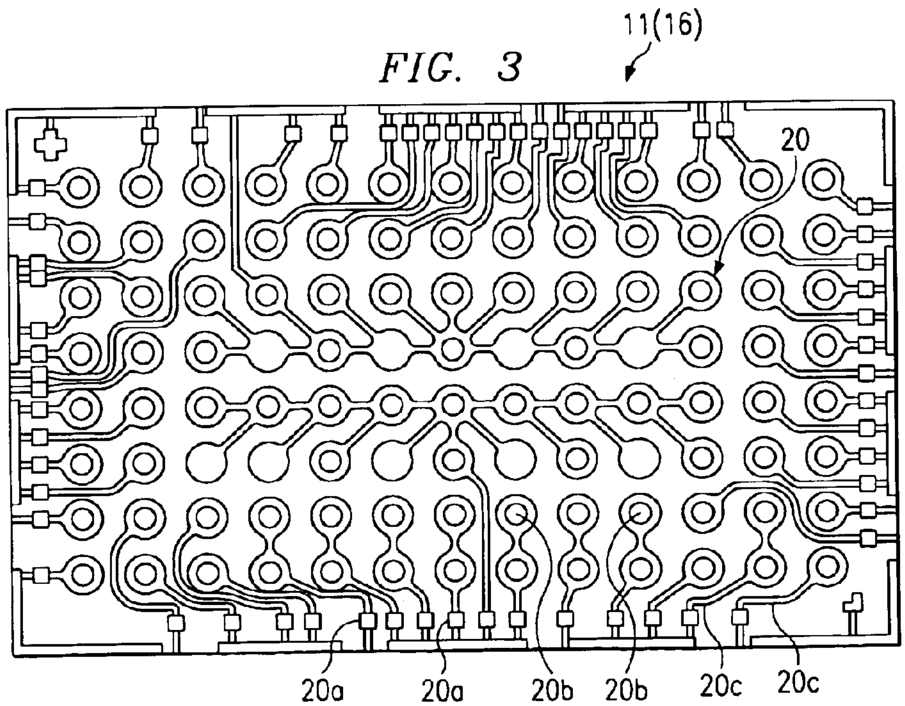

SEMICONDUCTOR CHIP MOUNTING SUBSTRATE AND SEMICONDUCTOR DEVICE USING IT

This application claims priority from Japanese patent application number 13(2001)-252658, filed Aug. 23, 2001.

FIELD OF THE INVENTION

The present invention pertains to a semiconductor chip mounting substrate equipped with conductor patterns formed on the substrate and an insulation pattern for insulating a semiconductor chip mounted on the substrate.

BACKGROUND OF THE INVENTION

Along with the supply of portable telephones, portable computers, and other small-scale electronic equipment, the demand for miniaturization of semiconductor devices mounted on them has increased. In semiconductor devices with LGA (Land Grid Array) and BGA (Ball Grid Array) structures, since an external connecting terminal as an interface to an external substrate can be two-dimensionally disposed on the bottom face of the semiconductor devices, its miniaturization is appropriately realized. In semiconductor devices with LGA and BGA structures, there is a type in which a semiconductor chip is mounted with the face down on a substrate and a type in which a semiconductor chip is mounted with the face up on a substrate. As the latter, semiconductor devices with a wire bonding system in which the semiconductor chip mounted with the face up on the substrate is electrically connected to the substrate by wire-bonding are broadly supplied.

A semiconductor device of the wire bonding system, for example, is manufactured through a process that prepares a substrate equipped with several chip mounting regions on its surface, a process that mounts a semiconductor chip via an adhesive in each chip mounting region of the above-mentioned substrate, a process that seals the semiconductor chip on the above-mentioned substrate with a molding resin, a process that forms bump electrodes for connecting an external substrate on the back face of the above-mentioned substrate, and a process that separates individual semiconductor devices by dicing the above-mentioned substrate.

As shown in FIG. 8, on the substrate of the above-mentioned substrate 100, conductor patterns 101 are formed in advance by etching treatment of a copper foil. The conductor patterns 101 include electrode part 101*a* for wire connection through wire bonding to a semiconductor chip in an external region of a chip mounting region 102, an electrode part 101*b* for a bump connection to bump electrodes for connecting an external substrate via holes, and circuit part 101*c* for connecting two electrode parts 101*a* and 101*b*. Since the circuit parts 101*c* and the electrode parts 101*b* for a bump connection of the conductor patterns 101 are also formed in the chip mounting region 102, it is necessary to prevent a short circuit of the semiconductor chip and the conductor pattern 101 when the semiconductor chip is mounted on the substrate 100.

In the above-mentioned conventional substrate 100, in order to prevent a short circuit of the semiconductor chip and the conductor pattern 101, an insulating layer (solder resist) 103 interposed between the semiconductor chip and the conductor pattern 101 is formed in the chip mounting region 102. The insulating layer 103 is formed by spreading a thermosetting insulator on the entire area of the chip mounting region 102 and thermally curing it. However, in the manufacture of the above-mentioned semiconductor device, since a flexible insulating film formed of polyimide resin is used as the substrate 100, the substrate is warped by curing contraction, etc., of the insulating layer 103, and if the warp exceeds an allowable amount, the following multiple problems result.

(1) In the manufacturing processes of the semiconductor device, when the substrate is set in a jig for conveying the substrate, if the warp of the substrate is large, the substrate cannot be effectively fixed to a positioning pin of the above-mentioned jig.

(2) In the manufacturing processes of the semiconductor device, when the semiconductor chip on the substrate is sealed with resin, if the warp of the substrate is large, the substrate cannot be effectively fixed to a positioning pin of a mold for molding, and problems result.

(3) In the manufacturing processes of the semiconductor device, when the semiconductor chip is mounted on the substrate, the substrate is set in a jig for forcing it into a planar state, an adhesive is spread on the substrate surface, and the semiconductor chip is mounted on it. However, if the warp of the substrate is large, when the substrate is removed from the jig, the warp of the substrate returns, so that bubbles (spaces) are generated between the adhered surface of the semiconductor chip and the insulating layer of the substrate, resulting in package cracks (appearance inferiority) and chip cracks. In particular, in a thin semiconductor device (1 mm or less), since the semiconductor chip is thin, it is necessary to set the amount of adhesive at a small amount so that the adhesive will not run into the semiconductor chip. For this reason, the warp of the substrate cannot be adsorbed by the low amount of adhesive, and bubbles are easily generated.

The objective of the present invention is to provide a semiconductor chip mounting substrate and a semiconductor device that not only can prevent the generation of problems due to the warp of the substrate in the manufacturing processes of the semiconductor device by reducing the warp of the substrate due to curing contraction, etc., of an insulation pattern while forming the insulation pattern on the surface of the substrate so that it may be interposed between a semiconductor chip and a conductor pattern, but can prevent the generation of package cracks and chip cracks due to the warp of the substrate in the manufactured semiconductor device.

SUMMARY OF INVENTION

In order to achieve the above-mentioned objective, the semiconductor chip mounting substrate of the present invention consists of an insulating substrate having a semiconductor chip mounting region on its principal plane, several conductor patterns that are formed on the principal plane of the above-mentioned insulating substrate and that include connecting parts electrically connected to electrode pads of the semiconductor chip being mounted, and an insulation pattern that is partially formed in the above-mentioned semiconductor chip mounting region and is interposed between the semiconductor chip being mounted and the above-mentioned conductor patterns.

The connecting parts of the above-mentioned several conductor patterns are preferably arranged along the outer periphery of the above-mentioned semiconductor chip mounting region. In this case, the electrode pads of the semiconductor chip being mounted in the semiconductor chip mounting region and the connecting parts of the conductor patterns can be connected by electroconductive wires. Since the insulation pattern is partially formed, the warp of the substrate due to curing contraction, etc. of the insulation pattern can be reduced.

The above-mentioned insulation pattern is preferably divided into three or more parts. In this case, since the semiconductor chip is supported at three points or more by the insulation pattern while the insulation pattern is partially formed in the semiconductor chip mounting region, short circuit of the semiconductor chip and the conductor pattern can be reliably prevented.

The above-mentioned insulation patterns are preferably arranged so that they may enclose the centroid position of the semiconductor chip being mounted. In this case, since the semiconductor chip is supported with good balance by the insulation patterns that enclose the centroid position of the semiconductor chip while the insulation pattern is partially formed in the semiconductor chip mounting region, short circuit of the semiconductor chip and the conductor pattern can be reliably prevented.

The above-mentioned insulation patterns are preferably arranged at the corner parts of the above-mentioned semiconductor mounting region. In this case, since the semiconductor chip is supported with good balance by the insulation patterns arranged at the corner parts of the semiconductor chip mounting region while the insulation pattern is partially formed in the semiconductor chip mounting region, short circuit of the semiconductor chip and the conductor pattern can be reliably prevented.

The above-mentioned insulation patterns are preferably several dotted patterns arranged at a prescribed interval. In this case, since the warp of the insulating substrate due to curing warp, etc., of the insulation pattern can be further reduced by reducing the formation area of the insulation pattern in the semiconductor chip mounting region and the semiconductor chip is supported at multiple points by the insulation pattern, short circuit of the semiconductor chip and the conductor pattern can be reliably prevented.

The above-mentioned insulation pattern is preferably divided into several parts using a slit-shaped notched part. In this case, the warp of the insulating substrate due to curing contraction, etc., of the insulation pattern can be reduced while broadly securing the support area of the semiconductor chip due to the insulation pattern.

The above-mentioned slit-shaped notched part is preferably disposed on diagonals of the above-mentioned semiconductor chip mounting region. In this case, the warp of the insulating substrate due to curing contraction, etc., of the insulation pattern can be further reduced by lengthening the slit-shaped notched part as far as possible.

The above-mentioned insulation pattern is preferably linearly disposed. In this case, the warp of the substrate due to curing contraction, etc., of the insulation pattern can be further reduced by reducing the formation area of the insulation pattern in the semiconductor chip mounting region.

The above-mentioned insulation is preferably disposed in a cross shape in the above-mentioned semiconductor chip mounting region. In this case, since the semiconductor chip is supported with good balance by the linear insulation pattern being disposed in a cross shape in the semiconductor chip mounting region while the insulation pattern is partially formed in the semiconductor chip mounting region, short circuit of the semiconductor chip and the conductor pattern can be reliably prevented.

In order to achieve the above-mentioned objective, the semiconductor device of the present invention consists of the above-mentioned semiconductor chip mounting substrate, a semiconductor chip mounted in a semiconductor chip mounting region of the above-mentioned semiconductor chip mounting substrate via an adhesive, and connecting members electrically connected with electrode pads of the above-mentioned semiconductor chip and connecting parts of the above-mentioned semiconductor chip mounting substrate.

BRIEF DESCRIPTION OF THE DRAWINGS

FIG. 1 is a cross section showing a semiconductor device manufactured using the insulating film of an embodiment of the present invention.

FIG. 2 is a plan view showing an insulating film.

FIG. 3 is a plan view showing an insulating film in which the insulation pattern is omitted.

REFERENCE NUMERALS AND SYMBOLS AS SHOWN IN THE DRAWINGS

Figure 4:
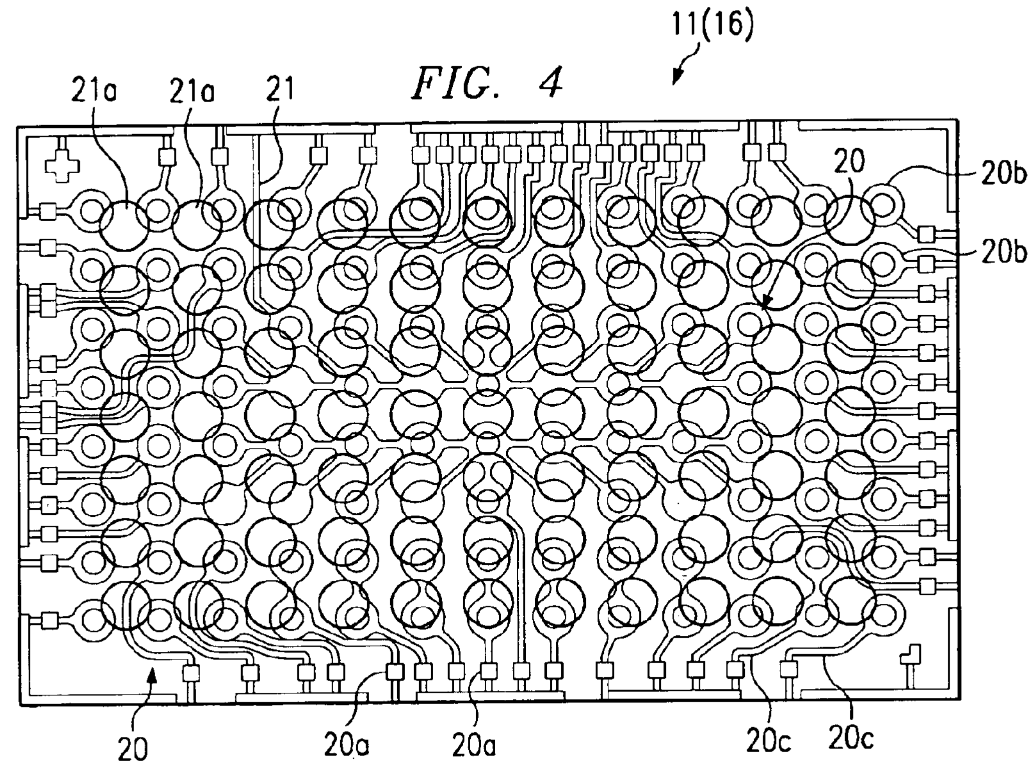
FIG. 4 is a plan view showing an insulating film exhibiting an insulation pattern.

In the figures, 10 represents a semiconductor device, 11 a substrate, 12 an adhesive, 13 a semiconductor chip, 14 a molding resin, 15 a bump electrode, 16 an insulating film, 18 a substrate region, 19 a chip mounting region, 20 a conductor pattern, and 21–25 insulation patterns.

DESCRIPTION OF THE EMBODIMENT

Next, an embodiment of the present invention is explained according to the figures. FIG. 1 is a cross section showing a semiconductor device manufactured using an insulating film of an embodiment of the present invention. As shown in the figure, said semiconductor device 10 consists of a substrate 11, a semiconductor chip 13 mounted via an adhesive 12 on the surface of said substrate 11, a molding resin 14 for sealing the semiconductor chip 13 mounted on the above-mentioned substrate 11, and bump electrodes 15 for connecting an external substrate formed on the back face of the substrate 11.

FIG. 2 is a plan view showing the insulating film. As shown in the figure, the insulating film 16 is equipped with holes 16*a* for conveying and positioning along its both sides. The insulating film 16 is supplied as a long film and is used by cutting into a desired size. For example, the insulating film 16 is a polyimide resin film with a thickness of about 50 μm and has several via holes 17 for electrically connecting conductor patterns, which will be mentioned later, to the above-mentioned bump electrodes 15, though they are omitted in the figure. In the insulating film 16, a number of substrate regions 18 are regularly arranged in the row and column directions. Each substrate region 18 is separated after mounting semiconductor chips 13 in chip mounting regions 19 secured in regions and constitutes the substrate 11 of the above-mentioned semiconductor device 10. Also, the insulating film 16 of this embodiment is divided into several blocks B in the longitudinal direction, and 90 pieces of substrate regions 18 are formed in each block B.

FIG. 3 is a plan view showing an insulating film in which the insulation pattern is omitted. As shown in the figure, the insulating film 16 is equipped with conductor patterns 20 on the surface of each substrate region 18. The conductor patterns 20 are formed by adhering at one time a metal foil (preferably, a coil foil) to the entire area on the insulating film 16 by an adhesive and removing unnecessary metal parts by lithography (etching). The conductor patterns 20 are equipped with electrode parts 20*a* for a wire connection to the electrode parts of the semiconductor chip 13 in an external region of the chip mounting region 19 by a wire bonding, electrode parts 20*b* for a bump connection to bump electrodes 15 via thru holes 17, and circuit parts 20*c* for connecting two electrode parts 20*a* and 20*b*. The circuit parts 20*c* and the electrode parts 20*b* for a bump connection of the conductor patterns 20 are formed in the chip mounting region 19, and when the semiconductor chip 13 is mounted in the chip mounting region 19, prevention of a short circuit between the semiconductor chip 13 and the semiconductor pattern 20 is required.

FIG. 4 is a plan view showing an insulating film exhibiting an insulation pattern. As shown in the figure, the insulating film 16 is equipped with an insulation pattern 21 in each chip mounting region 19. For example, the insulation pattern 21 is formed by spreading a thermosetting insulator on the insulating film 16 and thermally curing it. The insulation pattern 21 insulates the semiconductor chip 13 and the conductor pattern 20 by forming an insulating layer of about 12 μm on the conductor pattern 20. The insulation pattern 21 shown in FIG. 4 is formed by several dots 21 a (for example, circular dots with a diameter of 0.5 mm) arranged at a prescribed interval (for example, 0.7 mm) in the chip mounting region 19. In other words, the insulation pattern 21 is partially formed in the chip mounting region 19. Therefore, compared with the prior art in which the insulating layer has been formed in the entire area of the chip mounting region 19, the compressive stress exerted on the surface of the insulating film 16 along with the curing contraction of the insulator is reduced, so that warping of the insulating film 16 due to said compressive stress is suppressed. Also, the insulation pattern 21 is divided into three or more dots 21 a, encloses at least the centroid position of the semiconductor chip 13, and is arranged at four corners of the chip mounting region 19. Thus, the semiconductor device 13 is supported with good balance while the insulation pattern 21 is partially formed in the chip mounting region 19, so that a short circuit of the semiconductor chip 13 and the conductor pattern 20 can be reliably prevented.

Figure 5A:
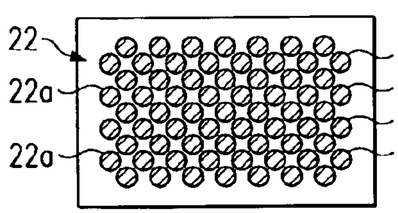
FIG. 5A–D show other examples of insulation patterns.
Figure 5B:
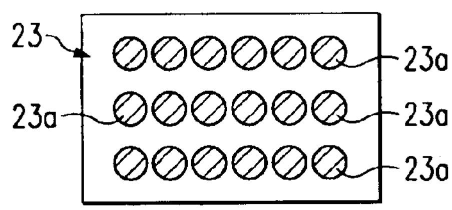
Figure 5C:
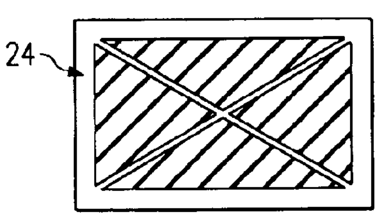
Figure 5D:
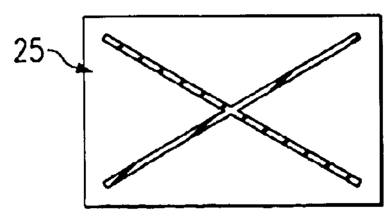

FIG. 5A–D show other examples of the insulation pattern. The insulation pattern 22 shown in FIG. 5(A) is formed by several dots 22*a* similarly to the insulation pattern 21 shown in FIG. 4 in the insulation pattern 22, the adjacent dots 22*a* are arranged with a position shift at each half pitch in the row and column directions, however an effect similar to that of the insulation pattern 21 shown in FIG. 4 can be obtained. The insulation pattern 23 shown in FIG. 5(B) is also formed by several dots 23*a* similarly to the insulation pattern 21 shown in FIG.4. In the insulation pattern 23, the dot diameter is greater than that of FIG. 4, however an effect similar to that of the insulation pattern 21 shown in FIG. 4 can be obtained. The insulation pattern 24 shown in FIG. 5(C) is separated via a slit-shaped non-insulating region. For this reason, warp of the insulating film 16 due to curing contraction, etc., of the insulation pattern 24 can be reduced while broadly securing the support area of the semiconductor chip 13 of the insulation pattern 24. Also, in this case, the slit-shaped non-insulating region is disposed on the diagonals of the chip mounting region 19. Thus, the slit-shaped non-insulating region is lengthened as far as possible, and warping of the insulating film 16 can be further reduced. The insulation pattern 25 shown in FIG. 5(D) is continuously disposed in the chip mounting region 19 without being divided into several parts, unlike the above-mentioned insulation patterns 21–24. Insulation pattern 25 is formed as crossing lines disposed on the diagonals of chip mounting region 19. For this reason, the formation area of the insulation pattern 25 in the chip mounting region 19 is reduced, and warping of the insulating film 16 can be further reduced. Also, the semiconductor chip 13 and the conductor pattern 20 can be reliably prevented.

Figure 6:
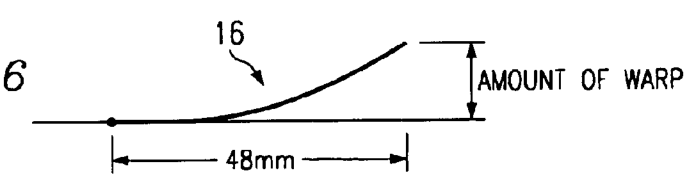
FIG. 6 shows measurement results of the amount of warp of an insulating film in which an insulating layer is formed in the entire area of the chip mounting region and the amount of warp of insulating films in which insulation patterns of the present invention are formed in the chip mounting region.
Figure 7A:
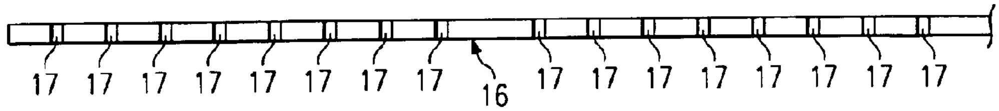
FIG. 7A–F show the manufacturing processes of a semiconductor device.
Figure 7B:
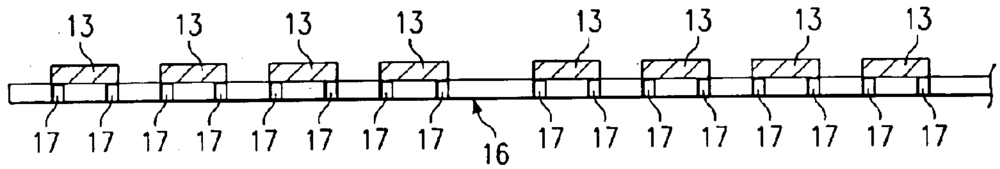
Figure 7C:
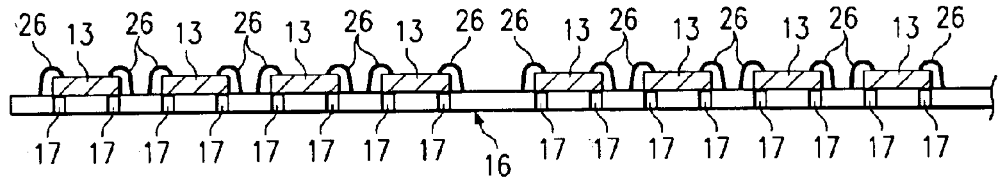
Figure 7D:
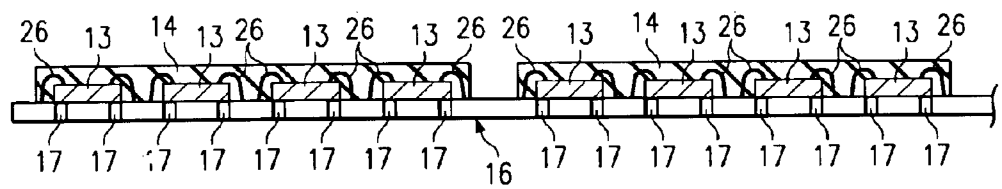
Figure 7E:
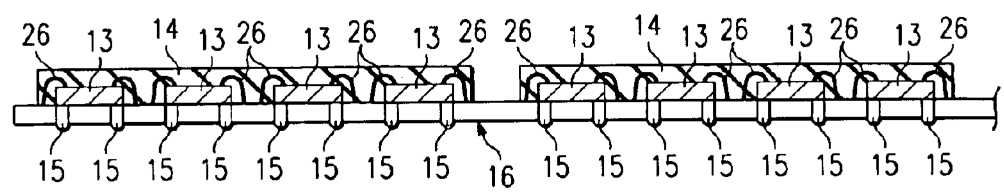
Figure 7F:
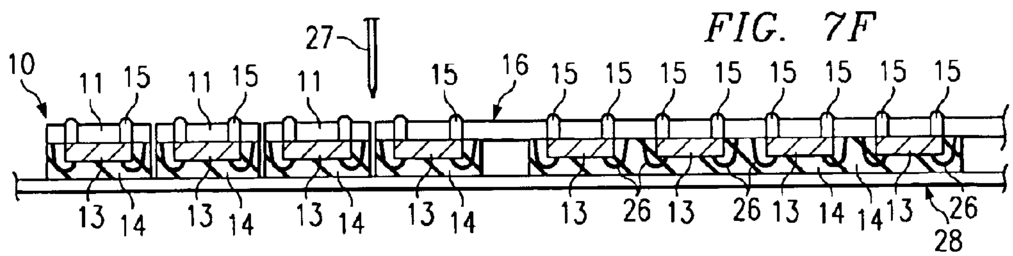
Figure 8:
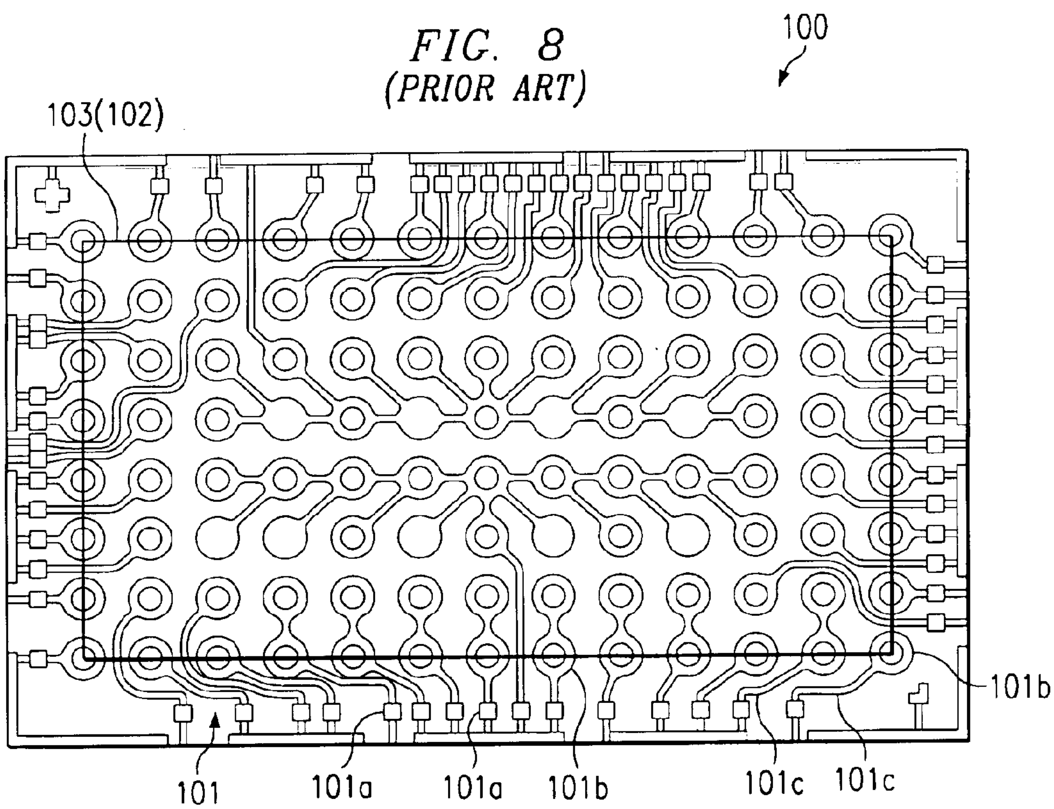
FIG. 8 is a plan view showing an insulating film in a conventional example.

FIG. 6 shows measurement results of the amount of warp of an insulating film in which an insulating layer is formed in the entire area of the chip mounting region and the amount of warp of insulating films in which the insulation pattern of the present invention is formed in the chip mounting region. As shown in the figure, in the measurement, using insulating film 16 with a width of 48 mm, the amount of warp of insulating film 16 in which an insulating layer was formed in the entire area of the chip mounting region 19, the amount of warp of insulating film 16 in which the insulation pattern 21 on the chip mounting region 19 shown in FIG. 4 was formed, and the amount of warp of insulating film 16 in which the insulation pattern 24 on the chip mounting region 19 shown in FIG. 5(C) was formed were measured. The amount of warp was assumed to be the vertical distance from the plane of the other end in the width direction wherein one end in the width direction of the insulating film 16 was fixed to the plane, and the amount of warp was measured in ten sheets each of insulating films 16. The amount of warp of insulating film 16 in which an insulating layer was formed in the entire area of the chip mounting region 19 was 10.1 mm minimum and 10.5 mm maximum. The average of ten sheets was 10.3 mm, and the standard deviation was 0.15811. Also, the amount of warp of insulating film 16 in which insulation pattern 21 was formed in the chip mounting region 19 was 3.7 mm minimum and 5.4 mm maximum. The average of ten sheets was 4.4 mm, and the standard deviation was 0.73144. Furthermore, the amount of warp of insulating film 16 in which insulation pattern 24 was formed in the chip mounting region 19 was 5.3 mm minimum and 6.3 mm maximum. The average of ten sheets was 5.82 mm, and the standard deviation was 0.42071. As a result, it was confirmed that the warp of insulating film 16 in which insulation patterns 21 and 24 of the present invention were formed in the chip mounting region 19 was reduced, compared with insulating film 16 in which an insulating layer was formed in the entire area of the chip mounting region 19.

Next, manufacturing processes of the semiconductor device 10 using insulating film 16 of the present invention are explained. FIG. 7 shows the manufacturing processes of a semiconductor device. As shown in the figure, in the initial process (A), the insulating film 16 is prepared. In insulating film 16, insulation patterns 21-25 are formed in the chip mounting region 19, and as mentioned above, the warp is reduced. Therefore, the insulating film 16 is reliably conveyed and positioned by a jig. In the next process (B), adhesive 12 is spread on the chip mounting region 19 of the insulating film 16, and the semiconductor chip 13 is mounted with the face up. At that time, in the chip mounting region 19 of the insulating film 16, as mentioned above, the warp is reduced, and the insulation patterns 21-25 support the semiconductor chip 13 with good balance, so that the lower surface of the semiconductor chip 13 is adhered to the chip mounting region 19 in a posture parallel to the insulating film 16 without contacting the conductor pattern 20. In the next process (C), the electrode parts of the semiconductor chip 13 and the electrode parts 20*a* for wire connection of the conductor pattern 20 are electrically connected by wire bonding (conductive wire 26). In the next process (D), the molding resin 14 is supplied onto the insulating film 16, and the semiconductor chip 13 is sealed with the resin. At that time, the insulating film 16 is reliably positioned by a jig since the warp is reduced as mentioned above. In the next process (E), bump electrodes 15 are formed on the back face of the insulating film 16. The bump electrodes 15 have a LGA or BGA structure, and the formed bump electrodes 15 are electrically connected to the electrode parts 20*b* for a bump connection of the conductor pattern 20 via the thru holes 17 of the insulating film 16. In the next process (F), the insulating film 16 and the molding resin 14 are separated into individual semiconductor devices 10 by dicing using a dicing blade 27. In the dicing, the insulating film 16 is fixed onto a dicing tape 28 with the molding resin 14 facing down as shown in the figure, and the dicing is carried out along the boundary line of the above-mentioned substrate regions 18. With the above processes, a number of semiconductor devices 10 are simultaneously manufactured.

Hereto, embodiments of the present invention have been explained with figures, however the present invention is not limited to the items shown in the above-mentioned embodiments, but also covered is the range where a concerned party can modify and apply the present invention based on the patent claim scope, the detailed explanation of the invention, and well-known techniques.

As mentioned above, according to the present invention, warp of the substrate due to curing contraction, etc., of the insulation pattern is reduced while forming the insulation pattern on the surface of the substrate so that it may be interposed between the semiconductor chip and the conductor pattern. As a result, not only can the generation of problems due to warp of the substrate be prevented in the manufacturing processes of the semiconductor device, but the generation of package cracks and chip cracks due to warp of the substrate in the manufactured semiconductor device can also be prevented.

What is claimed is:

1. A semiconductor chip mounting substrate, comprising an insulating substrate having a semiconductor chip mounting region on its principal plane, conductor patterns formed on the principal plane, and an insulation pattern comprising a plurality of parts separated by slits covering selected portions of said chip mounting region.

2. The semiconductor chip mounting substrate of claim 1, wherein the conductor patterns include connecting parts arranged along the outer periphery of the semiconductor chip mounting region.

3. The semiconductor chip mounting substrate of claim 1, wherein the insulation pattern is divided into three or more parts.

4. The semiconductor chip mounting substrate of claim 3, wherein the parts of the insulation pattern are arranged so that they enclose the centroid position of a semiconductor chip mounted on the chip mounting region.

5. The semiconductor chip mounting substrate of claim 3, wherein the parts of the insulation pattern are arranged at the corners of the chip mounting region.

6. The semiconductor chip mounting substrate of claim 1, wherein the slits separating the plurality of parts are arranged along the diagonals of the chip mounting region.

7. A semiconductor chip mounting substrate, comprising an insulating substrate having a semiconductor chip mounting region on its principal plane, conductor patterns formed on the principal plane, and an insulation pattern linearly disposed in a cross shape in the chip mounting region.

8. A semiconductor device, comprising:

a substrate having a principal surface, said substrate comprising conductor patterns on said principal surface in a chip-carrying region;

a plurality of insulating pads comprising triangular patterns separated by slits along the diagonals of the chip-carrying region disposed on said principal surface in said chip-carrying region; and a chip mounted over said chip-carrying region on said insulating pads.

9. The semiconductor device of claim 8, wherein said insulating pads are under the corners of said chip.

* * * * *